United States Patent
Watanabe (10) Patent No.: US 7,423,574 B2
(45) Date of Patent: Sep. 9, 2008

(54) ANALOG-TO-DIGITAL CONVERTER WITH PULSE DELAY CIRCUIT

(75) Inventor: Takamoto Watanabe, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/804,946

(22) Filed: May 21, 2007

(65) Prior Publication Data

US 2007/0268172 A1 Nov. 22, 2007

(30) Foreign Application Priority Data

May 22, 2006 (JP) .............................. 2006-141453

(51) Int. Cl.
*H03M 1/60* (2006.01)
(52) U.S. Cl. ..................... 341/157; 341/155; 341/166
(58) Field of Classification Search .................. 341/157
See application file for complete search history.

(56) References Cited

U.S. PATENT DOCUMENTS

| | | | |
|---|---|---|---|
| 5,396,247 A | | 3/1995 | Watanabe et al. |
| 6,466,151 B2 * | | 10/2002 | Nishii et al. ................ 341/155 |
| 6,509,861 B2 * | | 1/2003 | Watanabe ................... 341/157 |
| 6,771,202 B2 * | | 8/2004 | Watanabe et al. ........... 341/155 |
| 6,940,443 B2 | | 9/2005 | Terazawa et al. |
| 7,030,803 B2 | | 4/2006 | Harada et al. |

FOREIGN PATENT DOCUMENTS

| | | |
|---|---|---|
| JP | 5-259907 | 10/1993 |
| JP | 2005-94341 | 4/2005 |
| JP | 2005-229263 | 8/2005 |

* cited by examiner

*Primary Examiner*—Khai M Nguyen
(74) *Attorney, Agent, or Firm*—Harness, Dickey & Pierce, PLC (57) ABSTRACT

In a semiconductor-integrated A/D converter, a pulse delay circuit is provided with a plurality of delay units. The plurality of delay units each includes at least one logic gate and operates based on a level of an input signal. The pulse delay circuit is configured to transfer a pulse signal through the plurality of delay units while the pulse signal is delayed by the plurality of delay units. A delay time of each of the plurality of delay units depends on the level of the input signal. The at least one logic gate is composed of at least one first transistor. The at least one first transistor has a first threshold voltage. A generating circuit is configured to obtain a number of the delay units through which the pulse signal has passed within a predetermined period to generate digital data based on the obtained number. The generating circuit is composed of at least one second transistor. The at least one second transistor has a second threshold voltage. The first threshold voltage of the at least one first transistor is lower than the second threshold voltage of the at least one second transistor.

8 Claims, 8 Drawing Sheets

ANALOG-TO-DIGITAL CONVERTER WITH PULSE DELAY CIRCUIT

CROSS REFERENCE TO RELATED APPLICATIONS

This application is based on Japanese Patent Application 2006-141453 filed on May 22, 2006. This application claims the benefit of priority from the Japanese Patent Application, so that the descriptions of which are all incorporated herein by reference.

FIELD OF THE INVENTION

The present invention relates to analog-to-digital (A/D) converters designed as semiconductor integrated circuits (ICs) for outputting a pulse signal while delaying the pulse signal in stages.

BACKGROUND OF THE INVENTION

As high-resolution analog to digital converters with a simple circuit structure, time analog to digital converters, referred to as TAD converters, have been conventionally developed. Examples of the TAD converters are disclosed in U.S. Pat. No. 5,396,247 corresponding to Japanese Unexamined Patent Publication No. H05-259907.

The TAD converters of the U.S. patent publication are each composed of a plurality of digital circuits each configured to perform a particular logical function based on at least two discrete voltage levels.

Specifically, one typical example of the TAD converters includes a pulse delay circuit composed of a plurality of delay units that corresponds to a plurality of stages of delay. The delay units are connected to one another in series or in a ring-like structure.

In the TAD converter, when a pulse signal is input to one of the delay units corresponding to the first stage of delay, a pulse signal is sequentially transferred by the delay units while being delayed by the delay units in the order from the first stage of delay units toward the last stage thereof. On the other hand, an analog voltage signal as a target for A/D conversion is input to each delay unit as power supply voltage, so that the delay time of each delay unit depends on the level of the power supply voltage (the analog voltage signal) supplied to each delay unit.

Specifically, the TAD converter is designed to:

count a number of stages (pulse delay units) through which the pulse signal has passed within a predetermined sampling period during transfer; this number of pulse delay units though which the pulse signal has passed within the predetermined sampling period depends on the level of the input analog voltage signal; and output digital data of the level of the input analog voltage signal based on the counted number of stages (pulse delay units).

Such a TAD converter requires no analog circuits that perform particular functions based on a micro analog voltage signal and include an operational amplifier, resistors, and capacitors, which are essential for conventional A/D converters. This makes it possible to easily manufacture TAD converters at low cost using only CMOS (Complementary Metal-Oxide Semiconductor) digital IC manufacturing technology.

The minimum feature size of transistors, such as the dimensions of the smallest patterns, in a CMOS process using micromachining has gradually dropped below 0.1 μm (100 nm), 90-nm, and 65-nm and now reached 45-nm. Finer design rules for CMOS processes will have progressed in the future, so that the minimum feature size of transistors is expected to be lower than 30-nm in the near the feature.

Because TAD converters are each made up of a plurality of digital circuits, such a leading-edge technology in a CMOS process can be structurally applied to the manufacture of TAD converters.

In a TAD converter manufactured using a leading-edge CMOS process, breakdown voltages of transistors decreases depending on finer design rules for CMOS processes, which causes threshold voltages of transistors to decrease. In manufacturing or designing a TAD converter, in a plurality of transistors having threshold voltages from each other, desirable ones can be selected. Note that, the lower the threshold voltage of a transistor is, the higher the switching speed of the transistor is. However, the lower the threshold voltage of a transistor is, the more a leakage current in the transistor increase when switched.

Specifically, when a leading-edge technology in a CMOS process is applied to the manufacture of a TAD converter to make the threshold voltage of transistors decrease, the delay time of each delay unit of the pulse delay circuit decreases, and digital data output from the TAD converter has a high resolution.

The reduction in the threshold voltage of transistors however may increase a leakage current in the individual transistors constituting the TAD converter, which may increase dissipation of the whole of the TAD converter.

SUMMARY OF THE INVENTION

In view of the background, an object of at least one aspect of the present invention is to provide analog-to-digital converters, which are capable of reducing dissipation thereof while maintaining analog-to-digital conversion with a high resolution.

According to one aspect of the present invention, there is provided an analog-to-digital converter designed as a semiconductor integrated circuit. The analog-to-digital converter includes a pulse delay circuit provided with a plurality of delay units. The plurality of delay units each includes at least one logic gate and operating based on a level of an input signal. The pulse delay circuit is configured to transfer a pulse signal through the plurality of delay units while the pulse signal is delayed by the plurality of delay units. A delay time of each of the plurality of delay units depends on the level of the input signal. The at least one logic gate is composed of at least one first transistor. The at least one first transistor has a first threshold voltage. The analog-to-digital converter includes a generating circuit configured to obtain a number of the delay units through which the pulse signal has passed within a predetermined period to generate digital data based on the obtained number. The generating circuit is composed of at least one second transistor, the at least one second transistor having a second threshold voltage. The first threshold voltage of the at least one first transistor is lower than the second threshold voltage of the at least one second transistor.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the present invention will be described hereinafter with reference to the accompanying drawings.

First Embodiment

Figure 1A:
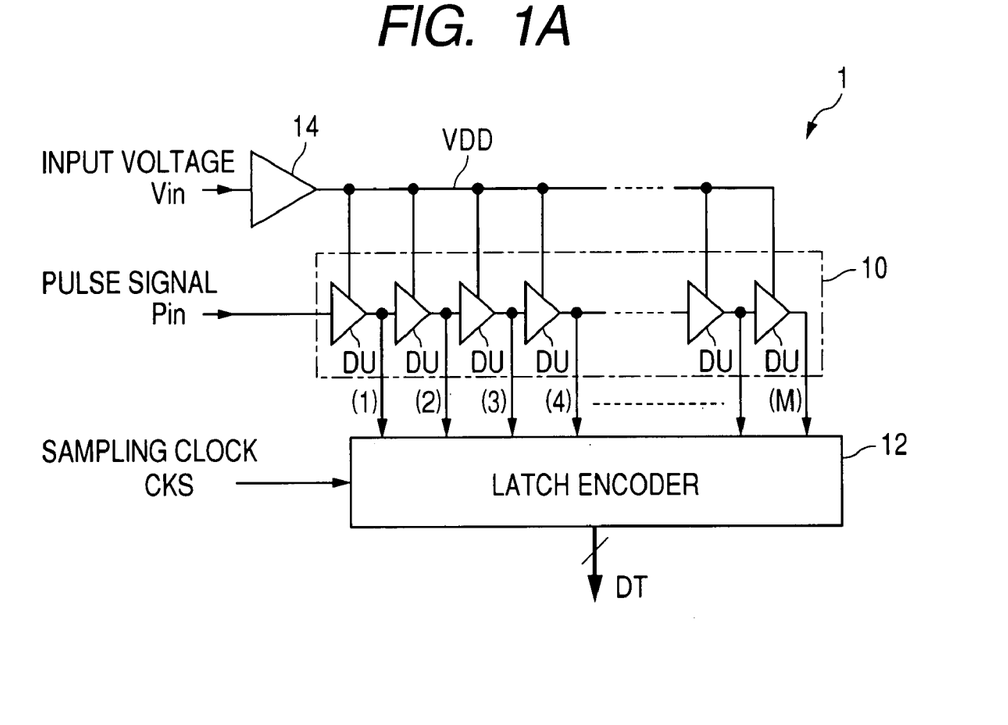
FIG. 1A is a block diagram schematically illustrating an example of the overall structure of an A/D converter according to a first embodiment of the present invention.
Figure 1B:
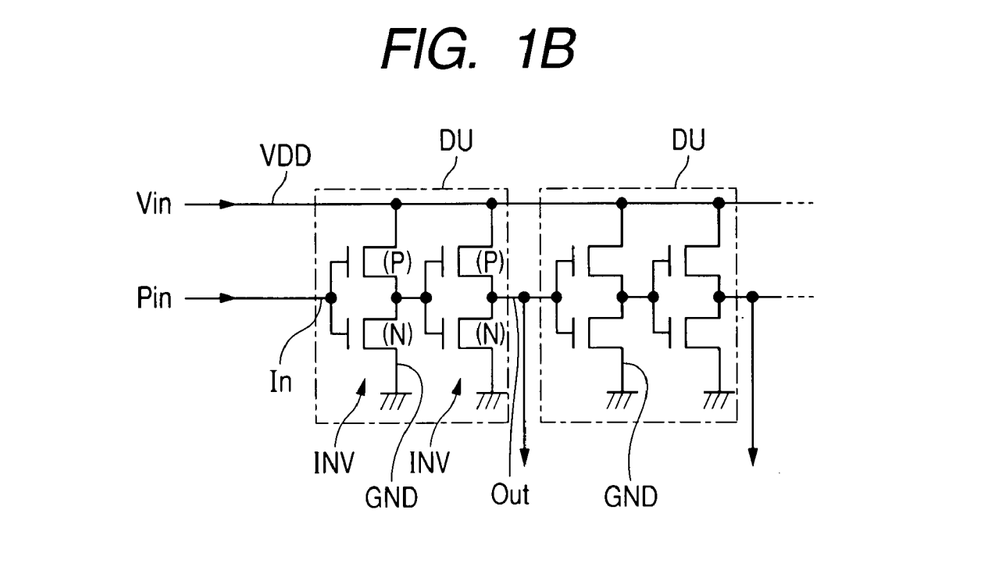
FIG. 1B is a circuit diagram schematically illustrating an example of the structure of delay units illustrated in FIG. 1A.

Referring to the drawings, in which like reference characters refer to like parts in several views, FIG. 1 illustrates an example of the overall structure of an analog to digital (A/D) converter 1 according to a first embodiment to which the present invention is applied.

As illustrated in FIG. 1A, the analog to digital converter, referred to simply as A/D converter, 1 is designed as a pulse phase difference coding circuit, such as a time analog to digital converter (TAD).

Specifically, as illustrated in FIG. 1A, the A/D converter 1 includes a pulse delay circuit, in other words, a straight delay line (SDL) 10. The pulse delay circuit 10 is composed of a number of M (M is a positive integer) of delay units DU that corresponds to the number M of stages in delay.

Each of the delay units DU has one input terminal and one output terminal.

One of the delay units DU located at one end of the straight delay line 10 constitutes a first stage of delay, which will also be referred to as "first delay unit" hereinafter. In addition, one of the delay units DU located at the other end of the straight delay line 10 constitutes a last stage of delay, which will also be referred to as "last delay unit" hereinafter.

The input terminal of a delay unit DU except for the first delay unit is connected to the output terminal of an adjacent delay unit DU except for the last delay unit so that the delay units DU are connected to each other in series.

The first delay unit DU is designed such that a pulse signal Pin is configured to be input to the one input terminal thereof.

When the pulse signal Pin is input to the one input terminal of the first delay unit DU, the first delay unit DU works to transfer the pulse signal Pin to the next delay unit DU while retarding it by a predetermined time of delay.

Each of the remaining delay units DU except for the last delay unit DU sequentially transfers the pulse signal Pin output from the previous delay unit to the next delay unit while retarding the pulse signal Pin by a predetermined time of delay.

The A/D converter 1 includes a latch encoder 12 connected to the output terminal of each of the delay units DU. A sampling clock CKS consisting of a train of periodic clock pulses is configured to be input to the latch encoder 12.

The latch encoder 12 is operative to detect a position that a significant edge of the pulse signal Pin has reached every time the sampling clock CKS is turned high, and convert the detected position of the pulse signal Pin into predetermined bits of binary digital data DT.

The digital data DT of the predetermined bits represents what number stage from the first stage (first delay unit) is a delay unit through which the pulse signal Pin at the detected position has passed.

Note that numerals inside the parentheses illustrated in FIG. 1A represent the number of stages in delay of the pulse delay circuit 10.

As illustrated in FIG. 1B, each of the delay units DU is designed as a first CMOS inverter gate INV consisting of a pair of a P-channel transistor (P-channel MOSFET) and an N-channel transistor (N-channel MOSFET) connected thereto in series, and a second CMOS inverter gate INV consisting of a pair of a P-channel MOSFET and an N-channel MOSFET connected thereto in series. The first CMOS inverter gate INV and the second CMOS inverter gate INV are connected to each other in series to constitute a buffer circuit working to output a signal input thereto while delaying it.

The A/D converter 1 includes a buffer 14 connected to a power supply unit (not shown) and operative to buffer a power supply voltage Vin being supplied thereto. As illustrated in FIG. 1B, a power supply terminal VDD for the power supply voltage Vin is connected to each of the delay units DU, and a ground terminal GND is connected to each of the delay units DU.

The buffer 14 is operative to apply the power supply voltage Vin to each of the delay units DU as a drive voltage through the power supply terminal VDD. In FIG. 1B, reference character In represents an input terminal of a delay unit DU, and reference character Out represents an output terminal of a delay unit DU.

Specifically, as illustrated in FIG. 1B, when the pulse signal Pin input to the first CMOS inverter gate INV of a delay unit DU is high, the N-channel MOSFET is on, so that an output signal of the first CMOS inverter gate INV of a delay unit DU is low. This allows the pulse signal Pin with a low state to be transferred from the first CMOS inverter gate INV. Similarly, when the pulse signal Pin input to the second CMOS inverter gate INV of a delay unit DU is low, the P-channel MOSFET is on, so that an output signal of the second CMOS inverter gate INV of a delay unit DU is high. This allows the pulse signal Pin with a high state to be transferred from the second CMOS inverter gate INV.

In contrast, when the pulse signal input to the first CMOS inverter gate INV of a delay unit DU is low, the P-channel MOSFET is on, so that an output signal of the first CMOS inverter gate INV of a delay unit DU is high. This allows the pulse signal Pin with a high state to be transferred from the first CMOS inverter gate INV. Similarly, when the pulse signal Pin input to the second CMOS inverter gate INV of a delay unit DU is high, the P-channel MOSFET is on, so that an output signal of the second CMOS inverter gate INV of a delay unit DU is low. This allows the pulse signal Pin with a low state to be transferred from the second CMOS inverter gate INV.

Specifically, a delay unit DU serves as a buffer unit such that the pulse signal Pin input to a delay unit DU is output therefrom while its logical state is kept unchanged.

Because an operating time of each of the inverter gates INV of each delay unit DU depends on the level of the input voltage Vin, the delay time of each delay unit depends on the level of the input voltage Vin. For this reason, the number of stages of the delay units DU through which the pulse signal Pin has passed within a predetermined sampling period TS equivalent to one period of the sampling clock CKS is configured to be proportional to the level of the input voltage Vin.

The latch encoder 12 includes a latch operative to, every time the sampling clock CKS is turned high, detect a position that a significant edge of the pulse signal Pin has reached. The latch encoder 12 includes an encoder operative to convert the detected position of the pulse signal Pin latched by the latch into predetermined bits of binary digital data DT.

The latch and the encoder of the latch encoder 12 are each configured to operate on a constant power supply voltage.

Specifically, in the A/D converter 1, the feed of the pulse signal Pin to the first delay unit DU and that of the sampling clock signal CKS to the latch encoder 12 allow the latch encoder 12 to output the digital data DT representing the level of the input voltage Vin.

The A/D converter 1 is configured as a semiconductor IC mounted on a semiconductor substrate (IC chip) using a CMOS process.

Note that in CMOS-circuit design rules applied to manufacturing of the A/D converter 1, various types of threshold voltages of transistors, such as a threshold voltage Vth1, a threshold voltage Vth2, a threshold voltage Vth3, and a threshold voltage Vth4, have been provided. The threshold voltage Vth4 is higher in level than the threshold voltage Vth3 (Vth4>Vth3), and the threshold voltage Vth3 is higher in level than the threshold voltage Vth2 (Vth3>Vth2). The threshold voltage Vth2 is higher in level than the threshold voltage Vth1 (Vth2>Vth1). Any one of the threshold voltages Vth1 to Vth4 can be selected for individual transistors or individual circuit blocks of the A/D converter 1.

Note that, upon implantation of impurity ions into the semiconductor substrate, control of impurity concentrations of individual circuit-regions on the semiconductor substrate for the A/D converter 1 with the use of a mask allows the threshold voltages of the individual circuit-regions to be changed.

Figure 2A:
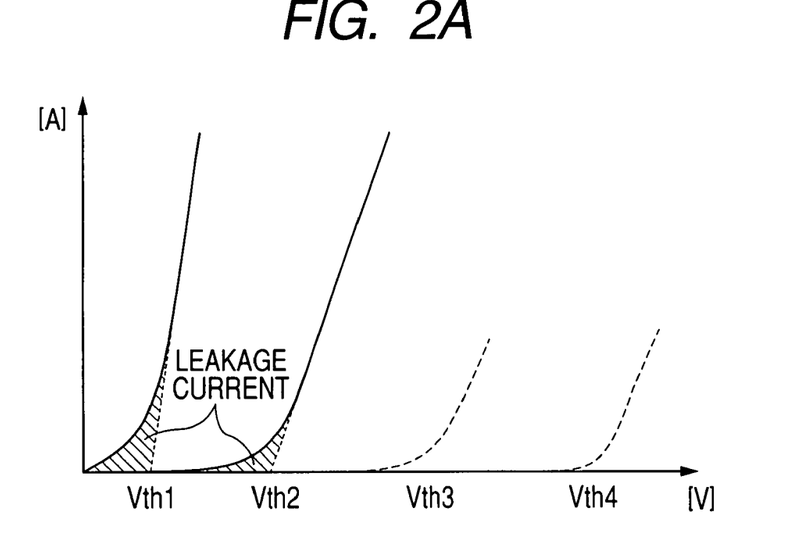
FIG. 2A is a graph schematically illustrating the volt-ampere characteristic of a transistor with reference to selectable threshold voltages.
Figure 2B:
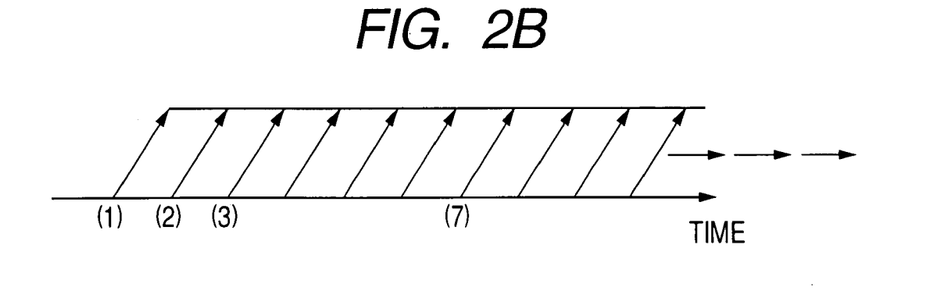
FIG. 2B is a view schematically illustrating operations of a pulse delay circuit whose structure is the same as the pulse delay circuit illustrated in FIG. 1A.
Figure 2C:
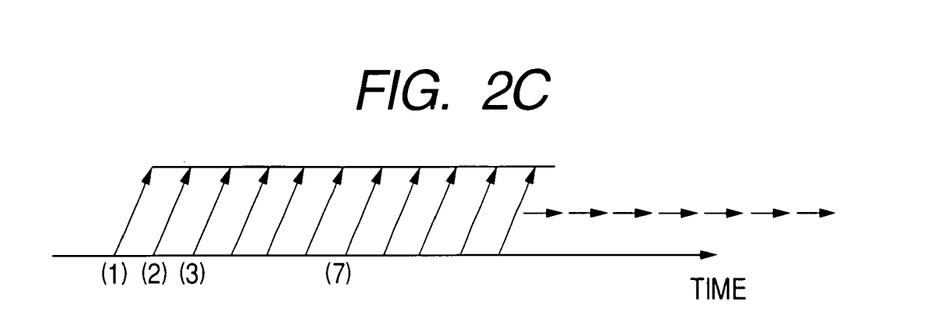
FIG. 2C is a view schematically illustrating operations of another pulse delay circuit whose structure is the same as the pulse delay circuit illustrated in FIG. 1A and whose transistors each have a threshold voltage lower than that of each transistor of the pulse delay circuit corresponding to FIG. 2B.

FIG. 2A schematically illustrates the volt-ampere characteristic of a transistor with reference to the selectable threshold voltages Vth1 to Vth4. In FIG. 2A, the horizontal axis expresses the volt [V], and the vertical axis expresses the ampere [A]. FIGS. 2B and 2C schematically illustrate operations of stages of delay (delay units) (1), (2), ... of pulse delay circuits 10A and 10B whose structures are the same as the pulse delay circuit 10. In FIG. 2B, the threshold voltage of each of the individual transistors of the pulse delay circuit 10A is set to a predetermined value higher than that of each of the individual transistors of the pulse delay circuit 10B whose operations are illustrated in FIG. 2C.

As illustrated in FIG. 2A, the lower the threshold voltage of a transistor is, the more a leakage current flowing through the transistor increases when the transistor is in off state.

In contrast, the lower the threshold voltage of a transistor is, the faster the operating speed of a CMOS inverter gate INV composed of the transistor is (see FIGS. 2B and 2C). This allows the number of stages of the delay units DU through which the pulse signal Pin has passed within the sampling period TS to increase.

Specifically, decrease of the threshold voltage of each of the individual transistors of the A/D converter 1 permits a resolution of the A/D converter 1 to increase when the sampling period TS is set to be constant. In addition, decrease of the threshold voltage of each of the individual transistors of the A/D converter 1 permits the sampling period TS to be shorten when a resolution of the A/D converter 1 is set to be constant.

In addition, in the CMOS-circuit design rules applied to manufacturing of the A/D converter 1, the minimum size of transistors has been determined, which allows transistors with various sizes larger than the minimum size to be freely used to manufacture the A/D converter 1.

Figure 3A:
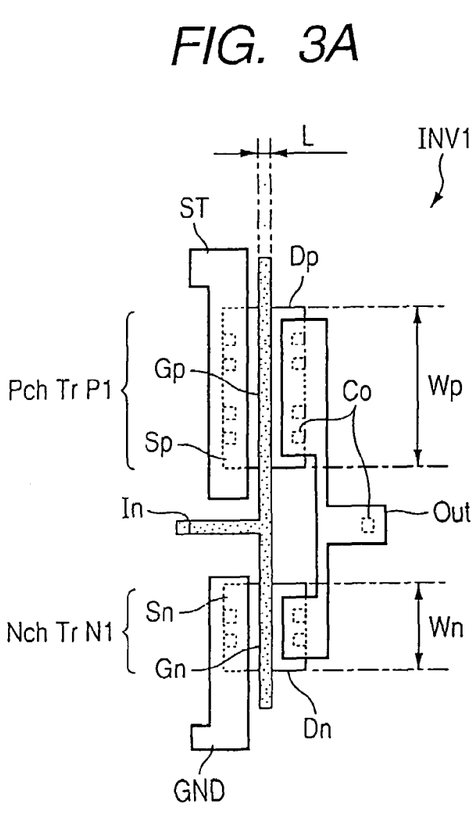
FIG. 3A is a view schematically illustrating a conductor pattern of a CMOS inverter gate to be used for the A/D converter illustrated in FIG. 1A, which uses a P-channel transistor and an N-channel transistor each of which has a minimum size.

FIG. 3A schematically illustrates a conductor pattern of a CMOS inverter gate INV1 to be used for the A/D converter 1; this CMOS inverter gate INV1 uses a P-channel transistor (abbreviated by P-ch Tr) P1 and an N-channel transistor (abbreviated by N-ch Tr) N1 each of which has the minimum size.

Figure 3B:
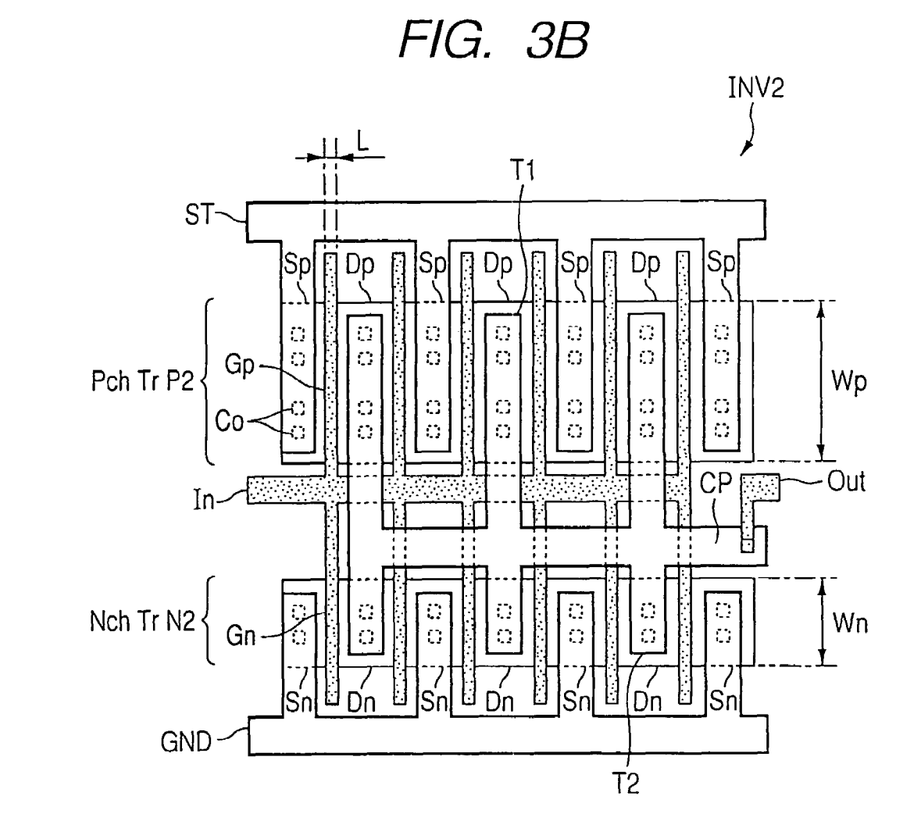
FIG. 3B schematically illustrates a conductor pattern of a CMOS inverter gate to be used for the A/D converter 1 illustrated in FIG. 1A, which uses a P-channel transistor and an N-channel transistor each of which has a size larger than the minimum size.

In addition, FIG. 3B schematically illustrates a conductor pattern of a CMOS inverter gate INV2 to be used for the A/D converter 1; this CMOS inverter gate INV2 uses a P-channel transistor P2 and an N-channel transistor N2 each of which has a size larger than the minimum size.

As illustrated in FIG. 3A, a substantially rectangular drain region Dp and a substantially rectangular source region Sp of the P-channel transistor P1 are formed on the semiconductor substrate with a channel region therebetween.

Similarly, a substantially rectangular drain region Dn and a substantially rectangular source region Sn of the N-channel transistor N1 are formed on the semiconductor substrate with a channel region therebetween such that the channel region of the P-channel transistor P1 and that of the N-channel transistor N1 is aligned with a space therebetween.

A substantially strip gate electrode Gp of the P-channel transistor P1 is formed on the channel region of the P-channel transistor P1 via an insulating film. A substantially strip gate electrode Gn of the N-channel transistor N1 extends from one end of the gate electrode Gp, and is formed on the channel region of the N-channel transistor N1 via an insulating film.

A conductive trace constituting the power supply terminal VDD is mounted on the source region Sp of the P-channel transistor P1 through contacts Co. A conductive trace constituting the ground terminal GND is mounted on the source region Sn of the N-channel transistor N1 through contacts Co.

A conductive trace constituting the input terminal In orthogonally extends from the integrated gate electrode Gp, Gn. A conductive trace constituting the output terminal Out is mounted on both the drain regions Dp of the P-channel transistor P1 and the drain region Dn of the N-channel transistor N1 via contacts Co.

A gate width L of the CMOS inverter gate INV1 corresponds to a channel length between the drain region Dp (Dn) and the source region Sp (Sn). A channel width Wp of the CMOS inverter gate INV1 corresponds to a width of the P-channel transistor P1 orthogonal to the channel length thereof. A channel width Wn of the CMOS inverter gate INV1 corresponds to a width of the N-channel transistor N1 orthogonal to the channel length thereof.

In addition, as illustrated in FIG. 3B, a plurality of substantially rectangular drain regions Dp and a plurality of substantially rectangular source regions Sp of the P-channel transistor P2 are alternatively formed on the semiconductor substrate with channel regions therebetween.

Similarly, a plurality of substantially rectangular drain regions Dn and a plurality of substantially rectangular source regions Sn of the N-channel transistor N2 are alternatively formed on the semiconductor substrate with channel regions therebetween such that the channel regions of the P-channel transistor P2 and those of the N-channel transistor N2 are aligned to each other with spaces therebetween.

A substantially comb gate has a strip electrode B arranged between the P-channel source and drain regions and the N-channel source and drain regions. The substantially comb gate has a plurality of strip gate electrodes Gp of the P-channel transistor P2 orthogonally extending from the strip electrode B.

The substantially comb gate has a plurality of strip gate electrodes Gn of the N-channel transistor N2 orthogonally extending from the strip electrode B.

The strip gate electrodes Gp are formed on the channel regions of the P-channel transistor P2 via insulating films, respectively.

The strip gate electrodes Gn of the N-channel transistor N2 respectively extend from one ends of the gate electrodes Gp, and are formed on the channel regions of the N-channel transistor N2 via insulating films, respectively.

A comb conductive trace constituting the power supply terminal VDD is mounted on the source regions Sp of the P-channel transistor P2 through contacts Co. A comb conductive trace constituting the ground terminal GND is mounted on the source regions Sn of the N-channel transistor N2 through contacts Co.

A conductive trace constituting the input terminal In orthogonally extends from the strip electrode B of the substantially comb gate.

A substantially comb conductive trace constituting the output terminal Out is arranged between the P-channel source and drain regions and the N-channel source and drain regions.

The substantially comb conductive pattern CP constituting the output terminal Out has a plurality of first traces T1 orthogonally extending therefrom and mounted on the drain regions Dp of the P-channel transistor P2 via contacts Co, respectively. The substantially comb conductive pattern CP has a plurality of second traces T2 orthogonally extending therefrom and mounted on the drain regions Dn of the N-channel transistor N2 via contacts Co, respectively.

A gate width L of each of the gate electrodes Gp, Gn of the CMOS inverter gate INV2 is equivalent to a channel length between each of the drain regions Dp (Dn) and a corresponding source region Sp (Sn) adjacent thereto.

A channel width Wp of the CMOS inverter gate INV2 corresponds to a width of the P-channel transistor P2 orthogonal to the channel length thereof. A channel width Wn of the CMOS inverter gate INV2 corresponds to a width of the N-channel transistor N2 orthogonal to the channel length thereof.

Specifically, as illustrated in FIGS. 3A and 3B, the gate width L of the CMOS inverter gate INV1 is designed to be substantially equivalent to the gate width L of each of the gate electrodes Gp, Gn of the CMOS inverter gate INV2.

In addition, the channel width Wp of the CMOS inverter gate INV1 is designed to be substantially equivalent to the channel width Wp of the CMOS inverter gate INV2, and the channel width Wn of the CMOS inverter gate INV1 is designed to be substantially equivalent to the channel width Wn of the CMOS inverter gate INV2.

Thus, change the number of the gate electrodes Gp and Gn of the CMOS inverter gate INV2 allows the size of the transistors P2 and N2 (the size of the CMOS inverter gate INV2) to be adjusted.

Note that, in the CMOS inverter gate INV1 illustrated in FIG. 3A, the channel width Wp designed to be greater than the channel width Wn allows the driving abilities of the P-channel transistor P1 and the N-channel transistor N1 to be matched with each other. Similarly, in the CMOS inverter gate INV2 illustrated in FIG. 3B, the channel width Wp designed to be greater than the channel width Wn allows the driving abilities of the P-channel transistor P2 and the N-channel transistor N2 to be matched with each other.

Moreover, each of transistors constituting the latch encoder 12 has the threshold voltage Vth4 that is the greatest in magnitude in the selectable threshold voltages Vth1 to Vth4. In addition, each of the transistors constituting the latch encoder 12 has the minimum size (see FIG. 3A).

In contrast, each of transistors constituting the pulse delay circuit 10 has the threshold voltage Vth1 that is the smallest in magnitude in the selectable threshold voltages Vth1 to Vth4. In addition, each of the transistors constituting the pulse delay circuit 10 has a size six times as much as the size of a transistor of the latch encoder 12 (see FIGS. 3A and 3B).

Figure 4A:
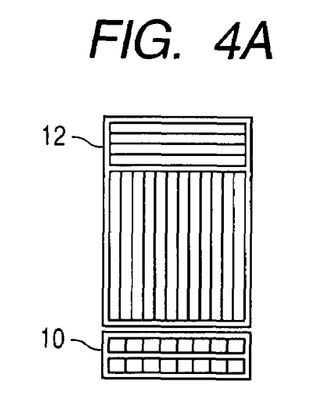
FIG. 4A is a view schematically illustrating an example of layout of a region of a pulse delay circuit and that of a latch encoder of the A/D converter illustrated in FIG. 1A.

FIG. 4A schematically illustrates an example of layout of a region of the pulse delay circuit 10 and that of the latch encoder 12 of the A/D converter 1 according to the first embodiment. In addition, FIG. 4B schematically illustrates a relationship between each of the regions and a corresponding one of the circuits 10 and 12.

Figure 4B:
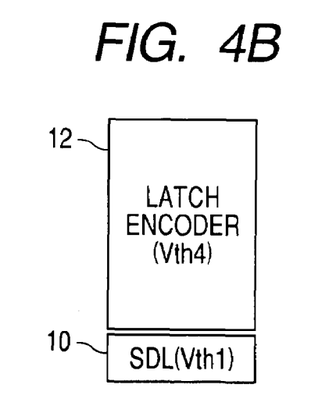
FIG. 4B is a view schematically illustrating a relationship between each of the regions and a corresponding one of the pulse delay circuit and the latch encoder of the A/D converter illustrated in FIG. 1A.

As illustrated in FIGS. 4A and 4B, the ratio of the area of the pulse delay circuit 10 to the whole area of the A/D converter 1 is substantially set to be 1/5, and the ratio is substantially constant independently of the number of stages in delay of the pulse delay circuit 10.

In the A/D converter 1 according to the first embodiment, the pulse delay circuit 10 is composed of a plurality of transistors each with the lowest threshold voltage Vth1. For this reason, it is possible to increase the operating speed of the pulse delay circuit 10 to thereby increase the number of stages of the delay units DU through which the pulse signal Pin has passed within the sampling period TS. This makes it possible for the A/D converter 1 to execute a high-speed analog-to-digital conversion with a high resolution.

In addition, the latch encoder 12 is composed of a plurality of transistors each having the highest threshold voltage Vth4 with a small leak current, and the ratio of the area of the pulse delay circuit 10 to the whole area of the A/D converter 1 is small. For this reason, increase of dissipation of the A/D converter 1 due to the pulse delay circuit 10 being composed of a plurality of transistors each with the lowest threshold voltage Vth1 with a large leak current is comparatively small in view of the whole of the A/D converter 1.

Thus, the A/D converter 1 according to the first embodiment allows a high-speed analog-to-digital conversion with a high resolution while preventing increase of dissipation thereof.

In the A/D converter 1 according to the first embodiment, the size of transistors constituting the pulse delay circuit 10 is larger than that of transistors constituting the latch encoder 12. This can reduce variations in the characteristics of the transistors constituting the pulse delay circuit 10 due to dimensional deviations of the transistors constituting the pulse delay circuit 10 in manufacturing and/or adhesion of debris particles onto the transistors constituting the pulse delay circuit 10.

This results in that the delay times of individual delay units DU can be uniformed with high accuracy, making it possible to provide the A/D converter 1 having a stable analog-to-digital conversion characteristic and a uniformed digital-data resolution output therefrom.

Note that, in order to increase the transistors constituting the pulse delay circuit 10 in size, if the channel width and/or the gate widths of the transistors are excessively increased, resistance of the gate electrodes of the transistors cannot be negligible. This may make it difficult to get the drivability depending on the channel width and/or the gate widths of the transistors.

To address this problem, in the A/D converter 1, the gate of the transistors has a substantially comb shape. This allows the area of the gate electrodes and/or the drivability of the transistors to be ensured while preventing resistance of the gate electrodes from increasing.

Moreover, the ratio of the area of the pulse delay circuit 10 to the whole area of the A/D converter 1 is small. For this reason, even if the size of transistors constituting the pulse delay circuit 10 is increased, it is possible to prevent the circuit size of the A/D converter 1 from increasing in view of the whole of the A/D converter 1.

Second Embodiment

Figure 5:
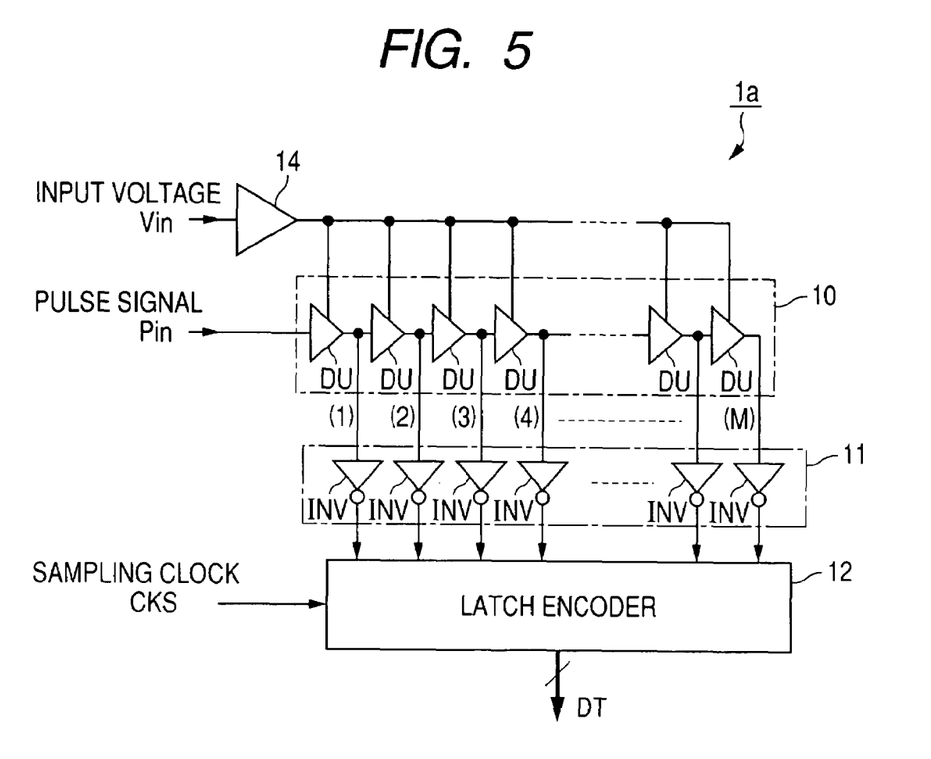
FIG. 5 is a block diagram schematically illustrating an example of the overall structure of an A/D converter according to a second embodiment of the present invention.

FIG. 5 schematically illustrates an example of the overall structure of an A/D converter 1a according to a second embodiment of the present invention.

As illustrated in FIG. 5, the A/D converter 1a includes a transfer buffer 11 arranged between the pulse delay circuit 10 and the latch encoder 12 in addition to the structure of the A/D converter 1 according to the first embodiment.

The transfer buffer 11 is composed of a plurality of CMOS inverter gates INV whose number is the same as the number of delay pulse signals Pin output from the respective delay units DU.

The transfer buffer 11 is operative to transfer the pulse signal Pin output from each of the delay units DU to the latch encoder 12.

The latch encoder 12 is operative to detect a position that a significant edge of the pulse signal Pin transferred from the transfer buffer 11 has reached every time the sampling clock CKS is turned high, and convert the detected position of the pulse signal Pin into predetermined bits of binary digital data DT.

The remaining elements of the A/D converter 1a are substantially identical to the corresponding elements of the A/D converter 1, and therefore, the descriptions of the remaining elements of the A/D converter 1a can be omitted.

The size of transistors constituting the transfer buffer 11 is larger than that of transistors constituting the latch encoder 12, and smaller than that of transistors constituting the pulse delay circuit 10.

In addition, each of the transistors constituting the transfer buffer 11 has a threshold voltage greater in magnitude than the threshold voltage Vth1 of transistors constituting the pulse delay circuit 10, and smaller in magnitude than the threshold voltage Vth4 of transistors constituting the latch encoder 12.

Specifically, each of the transistors constituting the transfer buffer 11 has the threshold voltage Vth2 or Vth3 that is the second or third in magnitude from the lowest threshold voltage Vth1 in the selectable threshold voltages Vth1 to Vth4. In addition, each of the transistors constituting the transfer buffer 11 has a size one to two times as much as the minimum size of a transistor based on the CMOS-circuit design rules applied to manufacture the A/D converter 1.

In the A/D converter 1a according to the second embodiment, the transfer buffer 11 is provided. The transfer buffer 11 is operative to gradually buffer the differences in threshold voltage and size between the transistors constituting the pulse delay circuit 10 and those constituting the latch encoder 12. This allows the pulse signal Pin to be captured to the latch encoder 12 while the pulse signal Pin has a normal state. This makes it possible to ensure stability in operation of the A/D converter 1a.

Third Embodiment

Figure 6:
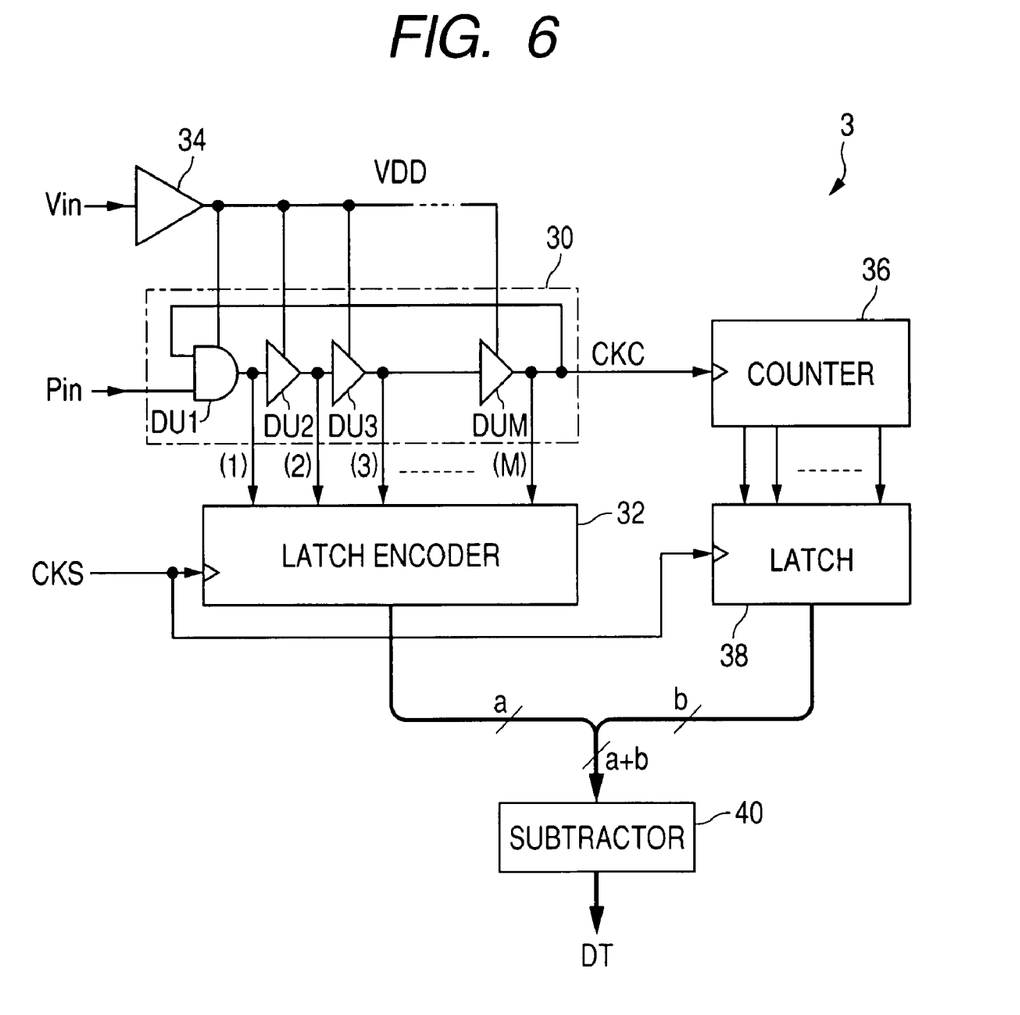
FIG. 6 is a block diagram schematically illustrating an example of the overall structure of an A/D converter according to a third embodiment of the present invention.

FIG. 6 illustrates an example of the overall structure of an analog to digital (A/D) converter 3 according to a third embodiment of the present invention.

Specifically, as illustrated in FIG. 6, the A/D converter 3 includes a pulse delay circuit, in other words, a ring delay line (RDL) 30. The pulse delay circuit 30 is composed of a number of M of delay units DU that corresponds to the number M of stages in delay. The M is set to $2^a$ (a is a positive integer).

Specifically, as the delay units DU, an AND gate DU1 and a plurality of inverters DU2 to DUM are preferably used.

The AND gate DU1 has one and the other input terminals and one output terminal, and is designed such that a pulse signal Pin is input to the one input terminal thereof.

The AND gate DU1 and the inverters DU2 to DUM are connected in series in a ring. That is, the other input terminal of the AND gate DU1 and an output terminal of the final stage of inverter DUM are connected to each other so that the AND gate DU1 and the inverters DU2 to DUM are serially connected to have a ring-like structure, constituting the ring delay line 30.

The pulse delay circuit 30, as necessary, includes a circuit (not shown) operative to adjust the level of the pulse signal input to the AND gate DU1 via the other input terminal thereof so as to continuously circulate the pulse signal Pin through the delay units DU.

Note that the detailed structure of the pulse delay circuit 30 has been described in, for example, U.S. Pat. No. 5,416,444 and 6,850,178 B2, so the descriptions of which are all incorporated herein by reference.

The A/D converter 3 includes a latch encoder 32 connected to the output terminal of each of the delay units DU. The sampling clock CKS is configured to be input to the latch encoder 32.

The latch encoder 32 is operative to detect a position that a significant edge of the pulse signal Pin has reached every time the sampling clock CKS is turned high, and convert the detected position of the pulse signal Pin into "a" bits of binary digital data (a is a positive integer).

The A/D converter 3 includes a buffer 34 connected to a power supply unit (not shown) and operative to buffer a power supply voltage Vin being supplied thereto. The buffer 34 is operative to apply the power supply voltage Vin to each of the delay units DU as a drive voltage through the power supply terminal VDD.

The A/D converter 3 also includes a b-bit synchronous counter (b is a positive integer) 36 serving as a coding circuit and connected to the output terminal of the final stage (delay unit DUM).

The counter 36 is operative to count up every time an output (circulating clock) CKC of the final stage DUM is input thereto.

The A/D converter 3 further includes a latch 38 connected to the counter 36. The sampling clock CKS is input to the latch 38.

Specifically, the latch 38 works to latch the count value of the counter 36 in response to a leading edge timing (a sampling timing) of the sampling clock CKS.

The A/D converter 3 includes a subtractor 40 connected to the latch encoder 32 and the latch 38.

The subtractor 40 is operative to:

input the "a" bits of binary digital data output from the latch encoder 32 as lower-order bits;

input the "b" bits of binary digital data output from the latch 32 as higher-order bits;

combine the higher-order bits and the lower-order bits, thereby generating digital data with the sum of "a" bits and "b" bits;

sequentially store the generated digital data every time the sampling clock CKS rises up; and subtract, from a current digital data with the sum of "a" bits and "b" bits generated at a current sampling timing, a previous digital data stored at a previous sampling timing to thereby outputting binary digital data DT.

In the structure of the A/D converter 3 set forth above, the feed of the pulse signal Pin to the AND gate DU1 and that of the sampling clock CKS to both the latch encoder 32 and the latch 38 allow the binary digital data DT representing the level of the input voltage Vin to be repeatedly output from the A/D converter 3 every sampling timing.

As well as the first embodiment, the A/D converter 3 is configured as a semiconductor IC mounted on a semiconductor substrate (IC chip) using a CMOS process.

In the third embodiment, transistors constituting each of the latch encoder 32, the counter 36, the latch 38, and the subtractor 40 except for the pulse delay circuit 30 have the threshold voltage Vth4 that is the greatest in magnitude in the selectable threshold voltages Vth1 to Vth4. In addition, the transistors constituting each of the latch encoder 32, counter 36, latch 38, and subtractor 40 except for the pulse delay circuit 30 have the minimum size (see FIG. 3A).

In contrast, each of transistors constituting the pulse delay circuit 30 has the threshold voltage Vth1 that is the smallest in magnitude in the selectable threshold voltages Vth1 to Vth4. In addition, each of the transistors constituting the pulse delay circuit 30 has a size one to ten times as much as the minimum size of a transistor (see FIGS. 3A and 3B).

Figure 7A:
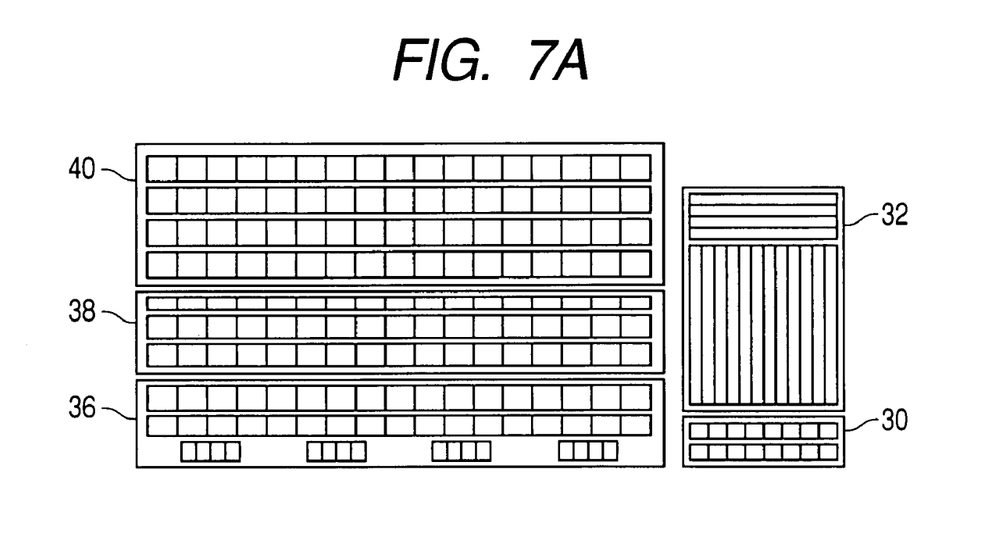
FIG. 7A is a view schematically illustrating an example of layout of a region of a pulse delay circuit and that of a latch encoder of the A/D converter illustrated in FIG. 6.

FIG. 7A schematically illustrates an example of layout of regions of the pulse delay circuit 30, latch encoder 32, counter 36, latch 38, and subtractor 40 of the A/D converter 3 according to the third embodiment. In addition, FIG. 7B schematically illustrates a relationship between each of the regions and a corresponding one of the circuits 30, 32, 36, 38, and 40.

Figure 7B:
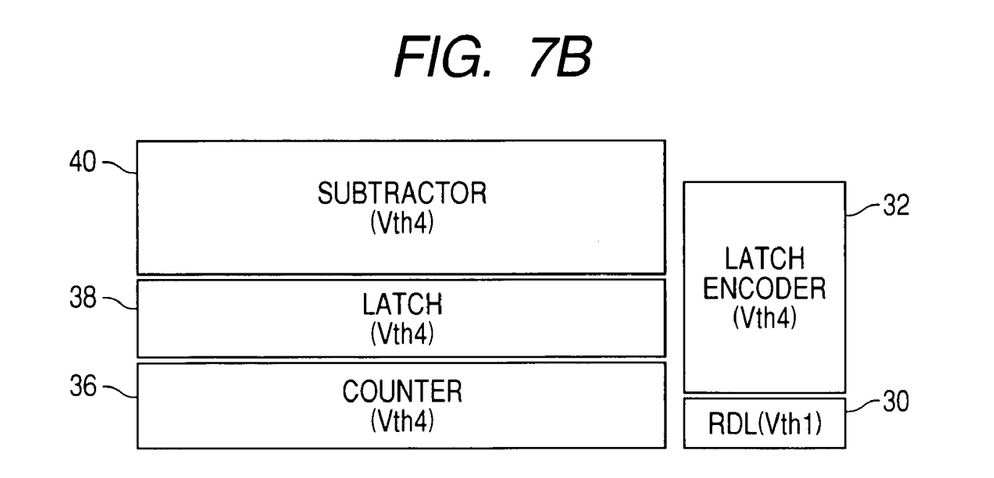
FIG. 7B is a view schematically illustrating a relationship between each of the regions and a corresponding one of the pulse delay circuit and the latch encoder of the A/D converter illustrated in FIG. 6.

Note that, in FIGS. 7A and 7B, the number of stages in delay of the pulse delay circuit 30 is set to be 16, and, as the counter 36, a 18-bit counter is used. In this case, as illustrated in FIGS. 7A and 7B, the ratio of the area of the pulse delay circuit 30 to the whole area of the A/D converter 3 is substantially set to be 1/20 or lower. The ratio varies depending on the number of stages in delay of the pulse delay circuit 30 and the number of bits of the counter 36.

In the A/D converter 3 according to the third embodiment, the pulse delay circuit 30 is designed as a ring delay line, and the number of circulations of the pulse signal Pin through the ring delay line is designed to be counted by the counter 36.

For this reason, the number of the stages of the delay units DU can be reduced, and therefore, the circuit size of the whole of the A/D converter 3 can be reduced.

In addition, in the A/D converter 3, the pulse delay circuit 30 is composed of a plurality of transistors each with the lowest threshold voltage Vth1. For this reason, it is possible to increase the operating speed of the pulse delay circuit 30 to thereby increase the number of stages of the delay units DU through which the pulse signal Pin has passed within the sampling period TS. This makes it possible for the A/D converter 3 to execute a high-speed analog-to-digital conversion with a high resolution.

In addition, each of the circuits 32, 36, 38, and 40 except for the pulse delay circuit 30 is composed of a plurality of transistors each having the highest threshold voltage Vth4 with a small leak current. In addition, the ratio of the area of the pulse delay circuit 30 to the whole area of the A/D converter 3 is further small as compared with the A/D converter 1 according to the first embodiment. For these reasons, increase of dissipation of the A/D converter 3 due to the pulse delay circuit 30 being composed of a plurality of transistors each with the lowest threshold voltage Vth1 with a large leak current is comparatively small in view of the whole of the A/D converter 3.

Thus, the A/D converter 3 according to the third embodiment allows a high-speed analog-to-digital conversion with a high resolution while preventing increase of dissipation thereof.

In the A/D converter 3 according to the third embodiment, the size of transistors constituting the pulse delay circuit 30 is larger than that of transistors constituting each of the latch encoder 32, counter 36, latch 38, and subtractor 40 except for the pulse delay circuit 30. This can reduce variations in the characteristics of the transistors constituting the pulse delay circuit 30 due to dimensional deviations of the transistors constituting the pulse delay circuit 30 in manufacturing and/or adhesion of debris particles onto the transistors constituting the pulse delay circuit 30.

This results in that the delay times of individual delay units DU can be uniformed with high accuracy, making it possible to provide the A/D converter 3 having a stable analog-to-digital conversion characteristic and a uniformed digital-data resolution output therefrom.

Fourth Embodiment

Figure 8:
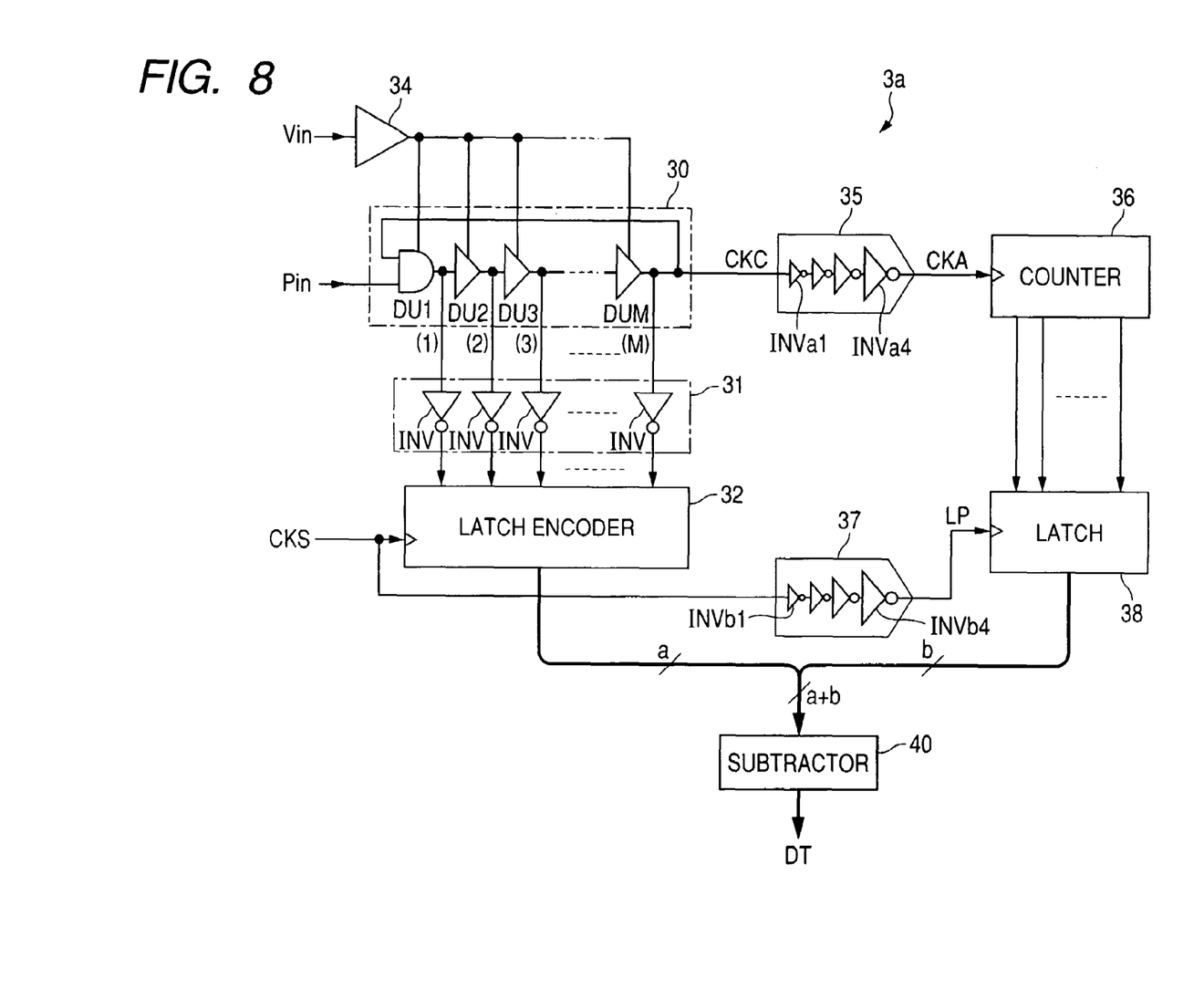
FIG. 8 is a block diagram schematically illustrating an example of the overall structure of an A/D converter according to a fourth embodiment of the present invention.

FIG. 8 schematically illustrates an example of the overall structure of an A/D converter 3a according to a fourth embodiment of the present invention.

As illustrated in FIG. 8, the A/D converter 3a includes a transfer buffer 31 arranged between the pulse delay circuit 30 and the latch encoder 32 in addition to the structure of the A/D converter 3 according to the third embodiment.

The transfer buffer 31 is composed of a plurality of CMOS inverter gates INV whose number is the same as the number of delay pulse signals Pin output from the respective delay units DU. The latch encoder 32 is operative to capture the pulse signal Pin output from any one of the delay units DU, and detect, every time the sampling clock CKS is turned high, the pulse signal Pin output from one of the delay units DU through a corresponding inverter INV of the transfer buffer 31.

In addition, the A/D converter 3a includes a drive buffer 35 connected to the output terminal of the final stage of the delay unit DU and to the counter 36 via an input line.

The drive buffer 35 is operative to receive the output (circulating clock) CKC of the final-stage delay unit DUM and supply, to the counter 36, the received circulating clock CKC as an operating clock CKA.

The A/D converter 3a includes a delay buffer 37 connected to the latch 38 via an input line, and configured such that the sampling clock CKS is input thereto.

The delay buffer 37 is operative to receive the sampling clock CKS and to supply the sampling clock CKS to the latch 38 as a latch pulse signal LP.

The remaining elements of the A/D converter 3a are substantially identical to the corresponding elements of the A/D converter 3, and therefore, the descriptions of the remaining elements of the A/D converter 3a can be omitted.

Transistors constituting each of the transfer buffer 31, drive buffer 35, and delay buffer 37 have a threshold voltage greater in magnitude than the threshold voltage Vth1 of transistors constituting the pulse delay circuit 30, and smaller in magnitude than the threshold voltage Vth4 of transistors constituting each of the latch encoder 32, counter 36, latch 38, and subtractor 40.

Specifically, each of the transistors constituting the transfer buffer 31, drive buffer 35, and delay buffer 37 has the threshold voltage Vth2 or Vth3 that is the second or third in magnitude from the lowest threshold voltage Vth1 in the selectable threshold voltages Vth1 to Vth4.

The transistors constituting the transfer buffer 31 have an intermediate size between the size of the transistors constituting each of the latch encoder 32, counter 36, latch 38, and subtractor 40, and that of the transistors constituting the pulse delay circuit 30. Specifically, each of the transistors constituting the transfer buffer 31 has a size one to two times as much as the minimum size of a transistor based on the CMOS-circuit design rules applied to manufacture the A/D converter 3.

The drive buffer 35 is composed of a plurality of CMOS inverter gates INVa1 to INVan, such as INVa1 to INVa4 in FIG. 8 as an example, connected to each other in series. The first-stage CMOS inverter gate INVa1 is connected to the output terminal of the final-stage delay unit DUM, and the final-stage CMOS inverter gate INVa4 is connected to the counter 36 via the input line. The size of the final-stage CMOS inverter gate INVa4 is set to have a drive capability sufficient to drive the counter 36 against the input capacitance of the input line.

The remaining COM inverter gates INVa1 to INVa3 have drivabilities gradually greater in the order from the first stage INVa1 to the third stage INVa3. In other words, the remaining COM inverter gates INVa1 to INVa3 have sizes gradually greater in the order from the first stage INVa1 to the third stage INVa3. Note that the first stage of the CMOS inverter gate INVa1 has a size larger than that of each of the transistors constituting the pulse delay circuit 30.

Similarly, the delay buffer 37 is composed of a plurality of CMOS inverter gates INVb1 to INVbn, such as INVb1 to INVb4 in FIG. 8 as an example, connected to each other in series. The first-stage CMOS inverter gate INVb1 is configured such that the sampling clock CKS is input thereto, and the final-stage CMOS inverter gate INVb4 is connected to the latch 38 via the input line. The size of the final-stage CMOS inverter gate INVb4 is set to have a drivability sufficient to drive the latch 38 against the input capacitance of the input line.

The remaining CMOS inverter gates INVb1 to INVb3 have drivabilities gradually greater in the order from the first stage INVb1 to the third stage INVb3. In other words, the remaining CMOS inverter gates INVb1 to INVb3 have sizes gradually greater in the order from the first stage INVb1 to the third stage INVb3. Note that the first-stage CMOS inverter gate INVb1 has a size equal to or greater than that of each of the transistors constituting the pulse delay circuit 30.

The total delay time of the drive buffer 35 is designed to be equivalent to that of the delay buffer 37.

In the structure of the A/D converter 3a set forth above, the transfer buffer 31 is provided. The transfer buffer 31 is operative to gradually buffer the differences in threshold voltage and size between the transistors constituting the pulse delay circuit 30 and the transistors constituting the latch encoder 32. This allows the pulse signal Pin to be captured to the latch encoder 32 while the pulse signal Pin has a normal state. This makes it possible to ensure stability in operation of the A/D converter 3a.

In addition, in the A/D converter 3a, the operating clock CKA is supplied to the counter 36 via the drive buffer 35. The size of the final stage of the CMOS inverter gate INVa4 is set to have a drive capability sufficient to drive the counter 36 against the input capacitance of the input line. For this reason, it is possible to ensure stability in operation of the counter 36 even if the counter 36 has many bits so that the input capacitance of the input line is high.

Similarly, in the A/D converter 3a, the latch pulse signal LP is supplied to the latch 38 via the delay buffer 37. The total delay time of the drive buffer 35 is designed to be equivalent to that of the delay buffer 37. For this reason, it is possible to match the operating timing of the counter 36 with the latch timing of the latch 38.

In each of the first to fourth embodiments, each of the delay units DU is composed of the first CMOS inverter gate INV and the second CMOS inverter gate INV connected to each other in series. The first CMOS inverter INV consists of a pair of a P-channel MOSFET and an N-channel MOSFET connected thereto in series, and the second CMOS inverter gate INV consists of a pair of a P-channel MOSFET and an N-channel MOSFET connected thereto in series. In addition, the input voltage Vin is configured to be input to each of the delay units DU as a drive voltage. The present invention however is not limited to the structure.

Figure 9A:
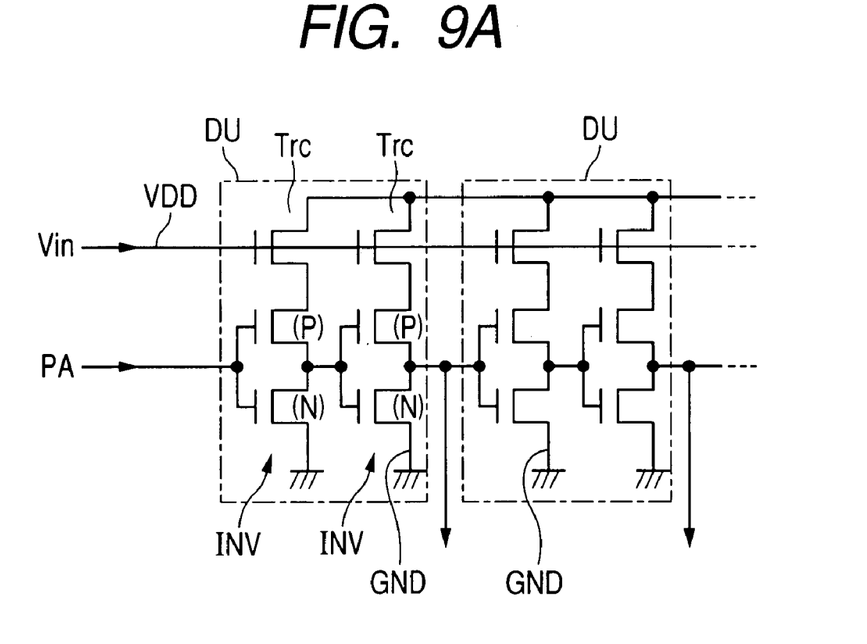
FIG. 9A is a circuit diagram schematically illustrating an example of the structure of delay units according to a modification of each of the first to fourth embodiments.

Specifically, as illustrated in FIG. 9A, a control transistor (MOSFET) Trc can be provided for each of the CMOS inverter gates INV. The input voltage Vin can be configured to be input to the gate of the control transistor Trc. The control transistor Trc can be operative to cause a drive current to flow through each of the CMOS inverter gates INV based on the input voltage Vin applied to the gate thereof.

Specifically, as illustrated in FIG. 9A, the operating time of each of the CMOS inverter gates varies depending on the change in the drive current to be supplied to each of the CMOS inverter gates. For this reason, control of the drive current to be supplied to each of the individual CMOS inverter gates INV can obtain the effects identical to those of the first to fourth embodiments. In this case, because the input impedance is increased, it is possible to omit the buffers 14 and 34.

Figure 9B:
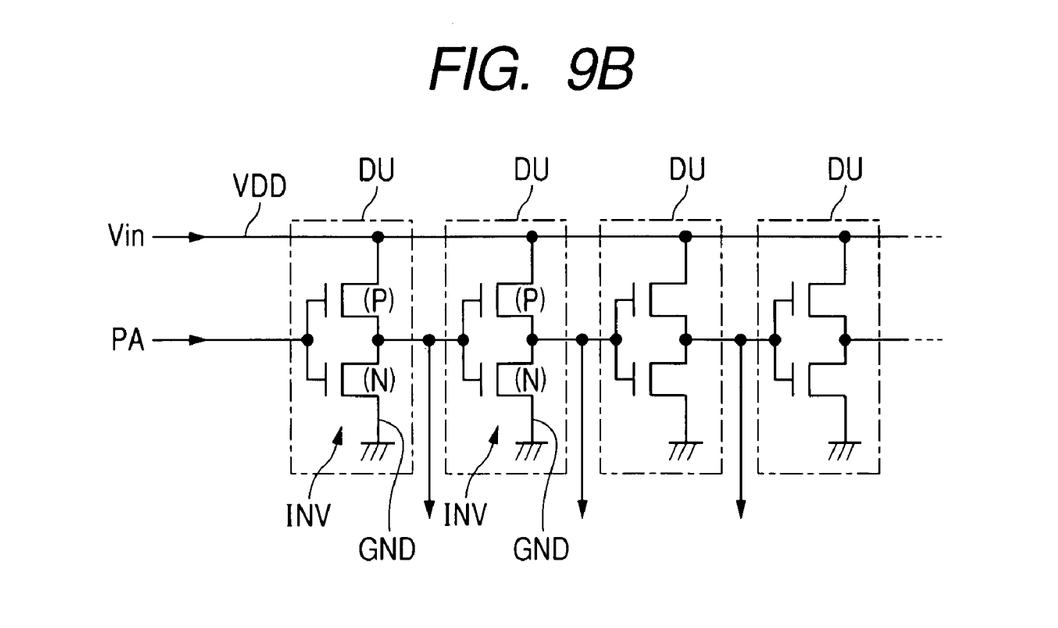
FIG. 9B is a circuit diagram schematically illustrating an example of the structure of delay units according to another modification of each of the first to fourth embodiments.

In addition, as illustrated in FIG. 9B, each of the delay units DU can be composed of a single stage of CMOS inverter gate INV consisting of a pair of a P-channel MOSFET and an N-channel MOSFET connected thereto in series. Moreover, each of the delay units DU can be composed of three or more stages of CMOS inverter gates INV.

In each of the first to fourth embodiments, change the number of the gate electrodes Gp and Gn of the CMOS inverter gate INV2 allows the size of the transistors P2 and N2 (the size of the CMOS inverter gate INV2) to be adjusted. Change of the gate width L of each of the gate electrodes Gp, Gn of the CMOS inverter gate INV2 can adjust the size of the transistors P2 and N2 (the size of the CMOS inverter gate INV2). In addition, change of the channel width Wp of the CMOS inverter gate INV2 and/or that of the channel width Wn of the CMOS inverter gate INV2 can adjust the size of the transistors P2 and N2 (the size of the CMOS inverter gate INV2).

In the second and fourth embodiments, each of the transistors constituting the transfer buffers 11 and 31 can have the threshold voltage Vth1 or Vth4.

In the third and fourth embodiments, transistors constituting the counter 36 can have a threshold voltage that is higher than the threshold voltage Vth1 and lower than the threshold voltage Vth4. In this case, especially in the fourth embodiment, transistors constituting the buffer circuit 35 and the delay buffer 37 can have a threshold voltage equal to or lower than a threshold voltage of transistors constituting the counter 36.

While there has been described what is at present considered to be the embodiments and their modifications of the present invention, it will be understood that various modifications which are not described yet may be made therein, and it is intended to cover in the appended claims all such modifications as fall within the true spirit and scope of the invention.

What is claimed is:

1. An analog-to-digital converter designed as a semiconductor integrated circuit, the analog-to-digital converter comprising:
    a pulse delay circuit provided with a plurality of delay units, the plurality of delay units each including at least one logic gate and operating based on a level of an input signal, the pulse delay circuit being configured to transfer a pulse signal through the plurality of delay units while the pulse signal is delayed by the plurality of delay units, a delay time of each of the plurality of delay units depending on the level of the input signal, the at least one logic gate being composed of at least one first transistor, the at least one first transistor having a first threshold voltage; and
    a generating circuit configured to obtain a number of the delay units through which the pulse signal has passed within a predetermined period to generate digital data based on the obtained number, the generating circuit being composed of at least one second transistor, the at least one second transistor having a second threshold voltage, the first threshold voltage of the at least one first transistor being lower than the second threshold voltage of the at least one second transistor.

2. An analog-to-digital converter according to claim 1, wherein the analog-to-digital converter is manufactured using a predetermined semiconductor-circuit design rule, the predetermined semiconductor-circuit design rule allowing use of a plurality of threshold voltages different from each other, the plurality of threshold voltages including the first threshold voltage and the second threshold voltage, the first threshold voltage of the at least one first transistor being set to the minimum threshold voltage in the plurality of threshold voltages.

3. An analog-to-digital converter according to claim 1, wherein the at least one first transistor has a first size, and the at least one second transistor has a second size, the first size of the at least one first transistor being greater than the second size of the at least one second transistor.

4. An analog-to-digital converter according to claim 1, wherein the at least one first transistor comprises a gate electrode, the gate electrode of the at least one first transistor has a substantially comb shape.

5. An analog-to-digital converter according to claim 1, wherein the at least one first transistor comprises:
    a semiconductor substrate;
    a plurality of drain regions;
    a plurality of source regions, the plurality of drain regions and the plurality of source regions being alternatively formed on the semiconductor substrate with channel regions therebetween; and
    a gate including:
        a first strip electrode arranged between the source and drain regions; and
        a plurality of second strip electrodes orthogonally extending from the first strip electrode, the plurality of strip second electrodes being arranged above the channel regions, respectively.

6. An analog-to-digital converter according to claim 1, further comprising a first buffer circuit arranged between the pulse delay circuit and the generating circuit and configured to transfer the pulse signal output from each of the delay units to the generating circuit, the first buffer circuit being composed of at least one third transistor, the at least one third transistor having a third threshold voltage, the third threshold voltage of the at least one third transistor having an intermediate level between the first threshold voltage and the second threshold voltage.

7. An analog-to-digital converter according to claim 6, wherein the plurality of delay units are serially connected to each other in a ring to form a ring delay line, and the generating circuit comprises:
    a counter configured to count a number of circulations of the pulse signal through the ring delay line;
    a lower-order coding circuit configured to detect a position that the pulse signal has reached every elapse of the period and convert the detected position of the pulse signal into lower-order bits of the digital data; and
    a higher-order coding circuit configured to output a count value of the counter as higher-order bits of the digital data, further comprising:
    a second buffer circuit configured to transfer one of the pulse signals output from the plurality of delay units to the counter as an operating clock.

8. An analog-to-digital converter according to claim 7, wherein the at least one first transistor has a first size, and the second buffer circuit is composed of at least one fourth transistor, the at least one fourth transistor having a size, the size of the at least one fourth transistor being greater than the first size of the at least one first transistor.

* * * * *